United States Patent [19]

Reddy

[11] Patent Number: 4,636,657

[45] Date of Patent: Jan. 13, 1987

[54] HIGH SPEED CMOS CLOCK GENERATOR

[75] Inventor: Chitranjan Reddy, Sugar Land, Tex.

[73] Assignee: Texas Instruments Incorporated, Dallas, Tex.

[21] Appl. No.: 645,578

[22] Filed: Aug. 29, 1984

[51] Int. Cl.[4] .................. H03K 19/096; H03K 19/01; H03K 17/04; H03K 4/58

[52] U.S. Cl. .................................. 307/269; 307/482; 307/578; 307/452

[58] Field of Search ............... 307/268, 269, 270, 443, 307/450, 453, 482, 578, 452, 480, 481

[56] References Cited

U.S. PATENT DOCUMENTS 4,508,978 4/1985 Reddy ................................ 307/269
4,521,701 6/1985 Reddy ................................ 307/578
4,542,310 9/1985 Ellis et al. ........................... 307/452

Primary Examiner—Stanley D. Miller
Assistant Examiner—David R. Bertelson
Attorney, Agent, or Firm—John G. Graham

[57] ABSTRACT

A -CMOS clock generator circuit is controlled by two clocks, one always going high before the other when entering an active cycle, and always going low before the other in entering a precharge cycle; this one clock precharges a capacitor through a P-channel transistor, and holds a drive node discharged. Two sets of semiconnected N-channel output transistors are used, with the gates of the top two driven by the drive node, and the gates of the bottom two driven by a CMOS inverter which has the second clock as its input. The inverter output also drives the gate of a P-channel transistor between the capacitor and the drive node. Another P-channel transistor with the first clock on its gate couples the drive node to the intermediate node of the first output pair. The second clock transfers the charge from the capacitor to the drive node, which also causes the capacitor to boot the drive node above the supply. When the first clock goes low it discharges the booted node to the supply rather than to ground.

6 Claims, 2 Drawing Figures

HIGH SPEED CMOS CLOCK GENERATOR

BACKGROUND OF THE INVENTION

This invention relates to semiconductor devices, and more particularly to clock generator circuits of the type used in CMOS VLSI dynamic memory devices.

Semiconductor memory devices of the dynamic read/write type employ a large number of internal clocks, which must drive large capacitive loads; the clock generator circuits used for this purpose are an important factor in determining the speed and power dissipation of the devices. An NMOS dynamic RAM of the 64K-bit size is illustrated in U.S. Pat No. 4,239,993 issued to McAlexander, White and Rao, and a clock generator used in such device is illustrated in U.S. Pat. No. 4,239,992, issued to Hong and Redwine, both patents asigned to Texas Instruments. In constructing a similar dynamic RAM in CMOS technology, and at higher bit density (such as 256K-bit or 1-Megabit), the necessity for low power dissipation and other such design constraints become more stringent.

It is the principal object of this invention to provide improved clock generator circuits for semiconductor integrated circuits such as memory devices, particularly devices made by CMOS processes. Another object is to provide an improved CMOS clock generator which operates from a simplified clock arrangement, which does not dissipate static power, in which the clock speed is not determined by charging of capacitors, in which unwanted excersions of the output voltage are avoided, in which a boosted voltage drives the output transistor, and in which impact ionization current is reduced.

SUMMARY OF THE INVENTION

In accordance with one embodiment of the invention, a CMOS clock generator circuit is controlled by two clocks, one always going high before the other when entering an active cycle, and always going low before the other in entering a precharge cycle; this one clock precharges a capacitor through a P-channel transistor, and holds a drive node discharged. Two sets of semi-connected N-channel output transistors are used, with the gates of the top two driven by the drive node, and the gates of the bottom two driven by a CMOS inverter which has the second clock as its input. The inverter output also drives the gate of a P-channel transistor between the capacitor and the drive node. Another P-channel transistor with the first clock on its gate couples the drive node to the intermediate node of the first output pair. The second clock transfers the charge from the capacitor to the drive node, which also causes the capacitor to boot the drive node above the supply. When the first clock goes low it discharges the booted node to the supply rather than to ground.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
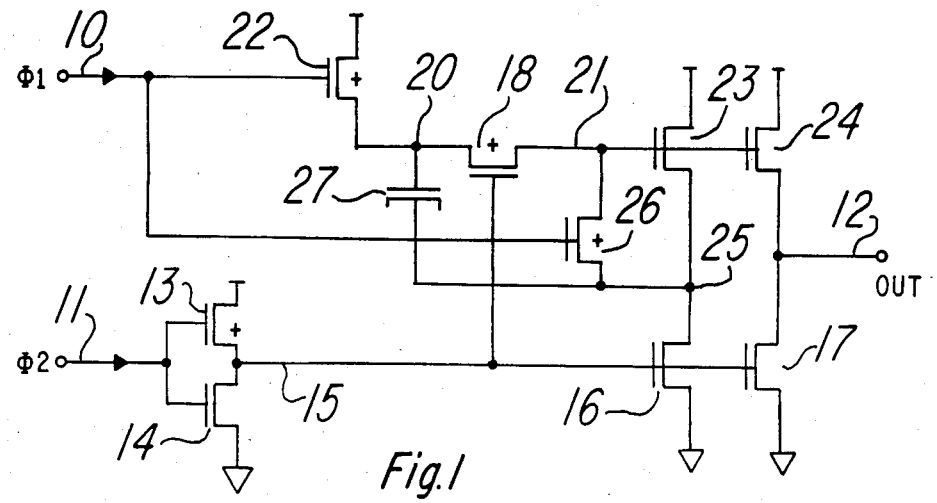
FIG. 1 is an electrical schematic diagram of a clock generator circuit according to the invention.
Figure 2:
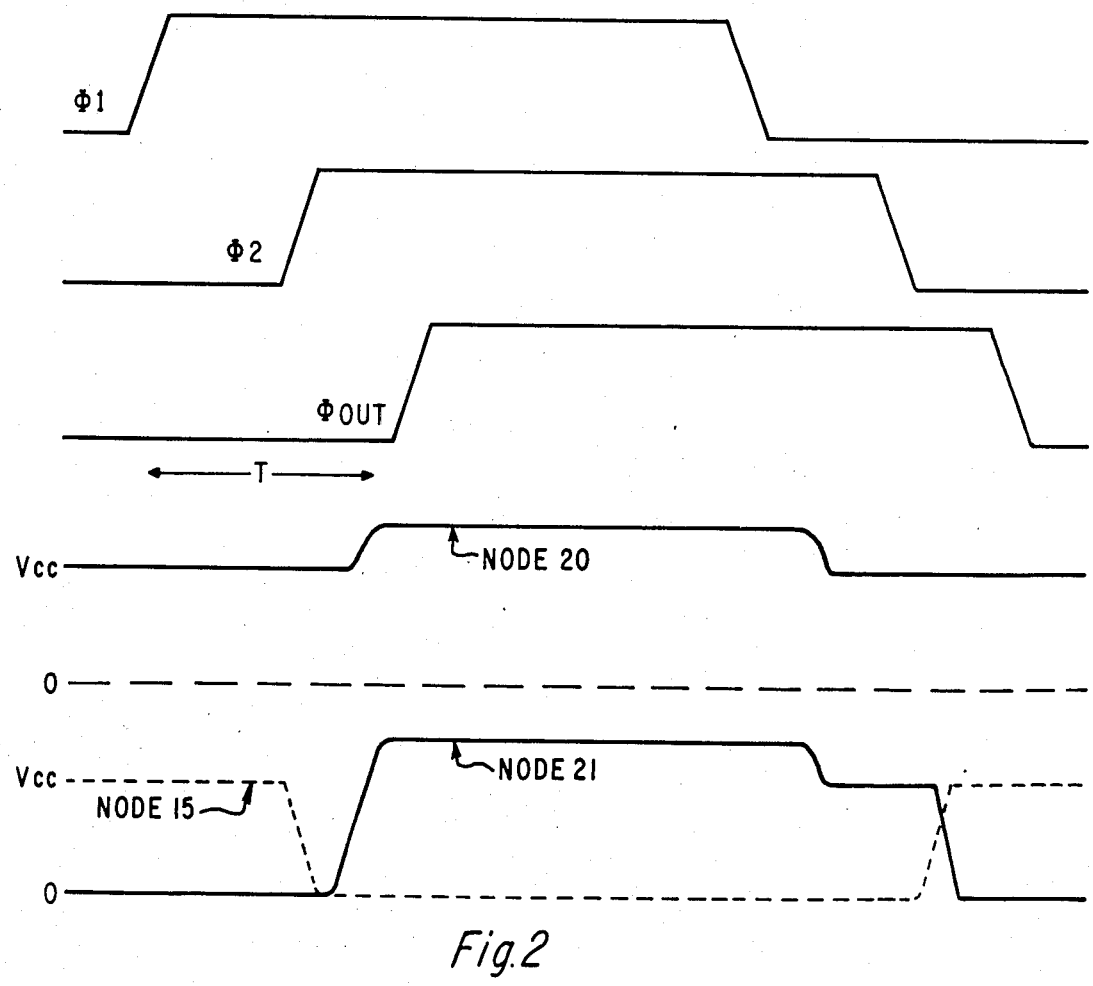
FIG. 2 is a timing diagram showing voltage as a function of time for various nodes in the circuit of FIG. 1.

Referring to FIG. 1, a CMOS clock generator is shown according to the invention. This circuit includes two clock inputs 10 and 11 to which clocks $\Phi 1$ and $\Phi 2$ are applied as seen in the waveforms of FIG. 2. The circuit produces an output $\Phi$out of FIG. 2 at an output node 12. This output goes high at a certain delay T from the rise of $\Phi 1$. The circuit employs a CMOS inverter with series connected transistors 13 and 14 having $\Phi 2$ on their gates. The output node 15 from this inverter is connected to the gates of two pull-down transistors 16 and 17 in the output stage, and is also connected to the gate of a series P-channel transistor 18 which is connected between nodes 20 and 21. The node 21 is connected to Vcc through an input transistor 22 having $\phi 1$ on its gate. The node 21 is connected to the gates of two N-channel pull-up transistors 23 and 24 in the output stage. A node 25 between the two transistors 16 and 23 is coupled to the node 21 by a transistor 26 with $\phi 1$ on its gate, and also coupled to the node 20 by a gated MOS capacitor 27.

In operation, when the clocks $\phi 1$ and $\phi 2$ are low the capacitor 27 is charged to Vcc through the transistor 22 which is on, and nodes 12, 21 and 25 are at zero because node 15 is high (P-channel transistor 13 is on, charging node 15 to Vcc). The P-channel transistor 18 is held off by node 15 at this time, thus isolating the capacitor 27 from the driver node 21. During an active cycle the clock $\Phi 1$ goes high first, and after that the clock circuit is fully controlled by $\Phi 2$; when $\Phi 1$ goes high the P-channel transistors 22 and 26 cut off, so node 20 is isolated in a charged state, and node 21 is no longer clamped to node 25. When $\Phi 2$ goes high, the node 15 discharges to ground through the N-channel transistor 14, thus turning on the P-channel transistor 18, which in turn transfers the trapped charge (capacitor 27 and node 20) onto the driver node 21, thus turning on the transistors 23 and 24. When transistor 23 turns on it boots the capacitor 27, and so transfers a signal above Vcc to the driver node 21 through the transistor 18. The output $\Phi$out goes from zero to full Vcc without any "front porch". At the end of an active cycle, for a precharge cycle $\Phi 1$ goes low first to discharge the booted voltage on the capacitor 27 and node 21 (through P-channel transistors 22 and 26 back to Vcc). Then when $\Phi 2$ goes low the node 15 goes high, isolating the capacitor 27 from the driver node 21. Also, when $\Phi 2$ goes low the transistor 16 turns on, discharging the node 21 through transistor 26, as well as discharging the nodes 12 and 25 to ground, without using any d.c. power. All of the transistors in the circuit are ratioless, and at any given point no transistors will discharge any signal from above Vcc to ground; thus the impact ionization current is reduced as well as the effects of hot electrons.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A clock circuit comprising:
   first and second clock voltages each switching between zero in a precharge cycle and to a supply voltage in an active cycle,
   an inverter having a pair of inverter transistors with source-to-drain paths connected in series between a voltage supply and ground, the gates of said transistors being coupled to said second clock voltage, the juncture of said transistors providing a first control node,
   first and second pairs of output transistors, the source-to-drain paths of the first pair being separately connected between ground and a second control node and an output node, respectively, the gates of the first pair of output transistors connected in common to said first control node, the source-to-drain paths of the second pair being separately connected between said supply and said second control node and said output node, respectively, the gates of the second pair of transistors connected in common to a driver node,
   a first transistor having its source-to-drain path connected between said supply and a charge node; a second transistor having its source-to-drain path connected between said charge node and said driver node; a third transistor having its source-to-drain path connected between said driver node and said second control node; the gates of said first and third transistors being connected to said first clock voltage; the gate of said second transistor being connected to said first control node;
   and a capacitor connected between said second control node and said charge node.

2. A circuit according to claim 1 wherein said inverter transistors include a P-channel transistor and an N-channel transistor.

3. A circuit according to claim 1 wherein said output transistors are N-channel; and said first, second and third transistors are P-channel.

4. A circuit according to claim 1 wherein said first clock voltage rises or falls before said second clock voltage.

5. A clock circuit comprising:
   first and second clock voltages each switching between zero in a precharge cycle and to a supply voltage in an active cycle,
   a CMOS inverter having a pair of inverter transistors with source-to-drain paths connected in series between a voltage supply and ground, the gates of such transistors being coupled to said second clock voltage, the juncture of such transistors providing a first control node,
   first and second pairs of N-channel output transistors, the source-to-drain paths of the first pair being connected separately between said ground and a second control node and an output node, respectively, the gates of the first pair of output transistors connected in common to said first control node, the source-to-drain paths of the second pair being separately connected between said supply and said second control node and said output node, respectively, the gates of the second pair of transistors connected in common to a driver node,
   a first P-channel transistor having its source-to-drain path connected between said supply and a charge node; a P-channel second transistor having its source-to-drain path connected between said charge node and said driver node; a third P-channel transistor having its source-to-drain path connected between said driver node and said second control node; the gates of said first and third P-channel transistor being connected to said first clock voltage; the gate of said second transistor being connected to said first control node;
   and a capacitor connected between said second control node and said charge node.

6. A circuit according to claim 5 wherein said first clock voltage makes a transition from ground to supply voltage while the second clock voltage is at ground.

* * * * *